United States Patent
Goja et al.

(10) Patent No.: US 8,805,293 B2
(45) Date of Patent: Aug. 12, 2014

(54) POWER SWITCHING FOR ELECTRONIC DEVICE TEST EQUIPMENT

(71) Applicant: Research in Motion Limited, Waterloo (CA)

(72) Inventors: Karoly Goja, Waterloo (CA); Jun Ni, Waterloo (CA); William Mark Dodd, Waterloo (CA); Arkady Ivannikov, Waterloo (CA)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 13/684,423

(22) Filed: Nov. 23, 2012

(65) Prior Publication Data

US 2013/0082725 A1  Apr. 4, 2013

Related U.S. Application Data

(63) Continuation of application No. 12/695,768, filed on Jan. 28, 2010, now Pat. No. 8,401,543.

(51) Int. Cl.
*H04B 17/00* (2006.01)

(52) U.S. Cl.
USPC .................. 455/67.14; 455/67.12; 455/67.11; 455/572

(58) Field of Classification Search
CPC . H04W 24/00; H04W 52/02; H04W 52/0225; H04B 17/0042; H04B 17/002; H04B 17/008
USPC .......................... 455/67.11, 67.12, 67.14, 572
See application file for complete search history.

(56) References Cited

U.S. PATENT DOCUMENTS

| | | | |
|---|---|---|---|
| 2002/0160768 A1* | 10/2002 | Gventer | 455/423 |
| 2006/0064266 A1* | 3/2006 | Mok | 702/117 |
| 2007/0132259 A1* | 6/2007 | Ivannikov et al. | 294/142 |

OTHER PUBLICATIONS

U.S. Appl. No. 12/695,768, Notice of Allowance dated Dec. 4, 2012.
European Patent Application No. 10152028.6, Extended Search Report dated Jul. 9, 2010.

* cited by examiner

*Primary Examiner* — April G Gonzales
(74) *Attorney, Agent, or Firm* — Steven M. Greenberg, Esq.; Gary Monka, Esq.; CRGO Law

(57) ABSTRACT

An apparatus, system and method are provided for testing a battery-powered electronic device-under-test in a transport frame engaged with a test fixture. A transport frame power supply is arranged to provide power to the DUT in a pre-testing stage. A switching circuit is arranged to switch from the transport frame power supply to a test fixture power supply in response to receiving a power switching signal indicating satisfaction of a pre-testing condition. Power from the test fixture power supply can then be switched back to the first transport frame, or to a second transport frame, to begin testing a second DUT. The ability to start a DUT test without having to wait for the DUT to boot-up in the test fixture reduces test time and increases efficiency of use of test equipment.

23 Claims, 10 Drawing Sheets

POWER SWITCHING FOR ELECTRONIC DEVICE TEST EQUIPMENT

FIELD

The present application relates generally to test equipment for battery powered electronic devices, such as mobile devices. More particularly, the present application relates to power switching for such test equipment.

BACKGROUND

A battery-powered electronic device typically undergoes a number of tests prior to large scale production. Such tests can be performed on a device-under-test (DUT), which is substantially similar with respect to functional components to the final production device, and in many cases is the final production device. For example, a mobile electronic device typically undergoes at least three tests: Radio Frequency Test, Audio Frequency Test, and Combined Functional Test. During the tests various parameters are measured, such as current and voltage.

To measure the parameters accurately, the DUT is powered via an external power supply, and its internal battery is removed. The tests can not be performed without having the device fully turned on. Some tests, such as a charging test, cannot be performed with the device's internal battery in place.

The DUT can be placed in a transport frame, which mates with a test fixture powered by the external power supply. After the device is connected with the external power supply, the device boots up since the device has been without battery power beforehand, and the tests are performed. If the device is booted up prior to insertion in the fixture, the device will lose the connection and will have to boot up again before the test can be performed.

Once the test is completed, the device is disconnected from the power supply and the next device is connected with the power supply. Upon being connected, the next device will boot up and the tests will be performed. As such, every time a device is connected to the power supply, the device boots up before tests can be performed.

DUT boot up can take 10-45 seconds, depending on the device. Since the test time itself is only about 30 seconds-2 minutes, the boot up contributes significant idle time to the overall testing process. Testing equipment and testing personnel are forced to remain idle while the device boots up, causing a bottleneck and preventing more devices from being tested during a given time period.

BRIEF DESCRIPTION OF THE DRAWINGS

Implementations will now be described, by way of example only, with reference to the attached Figures, wherein.

DETAILED DESCRIPTION

Figure 1:
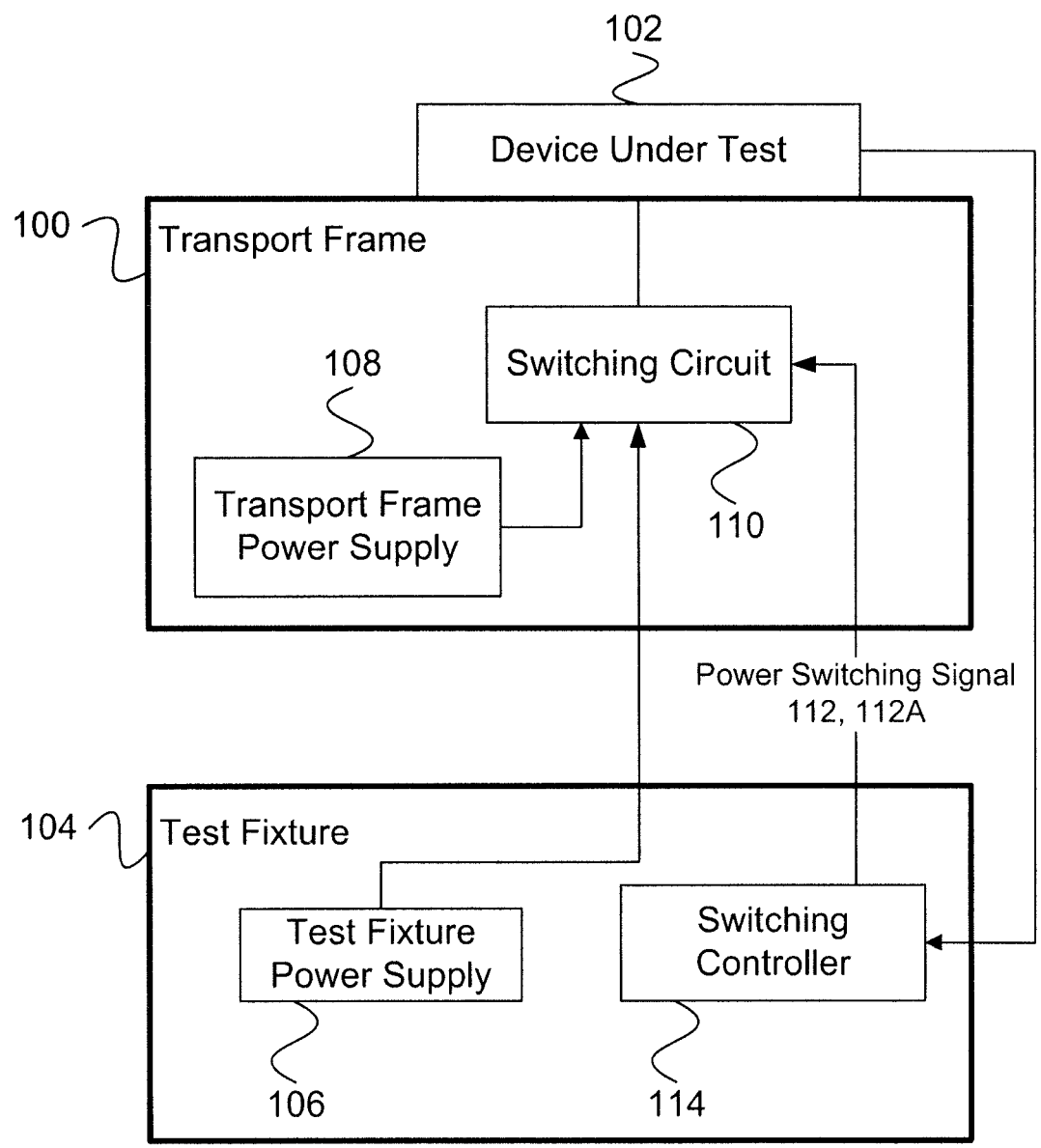
FIG. 1 illustrates a block diagram of an apparatus for testing a battery-powered device-under-test in a test fixture according to an implementation of the present application.

Generally, the present application provides a method and apparatus for testing a battery-powered electronic device-under-test in a transport frame engaged with a test fixture. A transport frame power supply is arranged to provide power to the DUT in a pre-testing stage. A switching circuit is arranged to switch from the transport frame power supply to a test fixture power supply in response to receiving a power switching signal indicating satisfaction of a pre-testing condition. Power from the test fixture power supply can then be switched back to the first transport frame, or to a second transport frame, to begin testing a second DUT. The ability to start a DUT test without having to wait for the device to boot-up in the test fixture reduces test time and increases efficiency of use of test equipment.

Implementations of the present application can reduce equipment utilization per test, increase equipment utilization efficiency, increase production efficiency and decrease overall device testing cost.

For example, test equipment such as the Agilent 8960 Series 10 Wireless Communications Test Set, cost about $35,000-$40,000 or more each. Keeping such equipment idle is a waste of expensive resources. Without redesigning the device operating system to reduce boot time, implementations of the present application can reduce test time by addressing the contribution of such boot-up time. Such challenges are faced by manufacturers of battery powered electronic devices, such as mobile device or mobile phone manufacturers, or any other entity operating in a similar testing environment.

Implementations of the present application can be applied to testing any battery-powered electronic device that has a boot up time.

A test station cannot communicate with a DUT and start testing until the DUT fully boots up. By booting up the DUT before plugging the DUT into test station, a tester can communicate with the DUT immediately through USB and start testing.

In an implementation, the present application provides an apparatus for testing a DUT, such as a mobile device, in a test fixture. The test fixture is arranged to receive the transport frame and to test the DUT when the transport frame is engaged with the test fixture. The test fixture includes a test fixture power supply arranged to provide power to the electronic device in a testing stage. The apparatus includes a transport frame power supply arranged to provide power to the DUT in a pre-testing stage, and a switching circuit. The switching circuit is arranged to switch from the transport frame power supply to the test fixture power supply in response to receiving a first power switching signal indicating satisfaction of a pre-testing condition, and arranged to switch from the test fixture power supply to the transport frame power supply in response to receiving a second power switching signal indicating completion of a testing stage.

The apparatus can further include a switching controller to control power switching between the transport frame power supply and the test fixture power supply, the switching controller being arranged to generate the first and second power switching signals. The switching controller can be provided in the test fixture. The switching controller can include a machine readable medium storing statements and instructions for execution by a processor to control power switching between the transport frame power supply and the test fixture power supply.

The switch from the transport frame power supply to the test fixture power supply can cause a voltage drop, and the switching circuit can be arranged such that the voltage drop is below a reboot tolerance for the DUT.

The switching circuit can include a load switch, such as a metal oxide semiconductor field effect transistor (MOSFET). The switching circuit can include an isolator arranged to electrically isolate the transport frame power supply from the test fixture power supply.

In another implementation, the present application provides a method of power switching in a system for testing a DUT, the system including a transport frame and a test fixture arranged to receive the transport frame and to test the DUT when the transport frame is engaged with the test fixture. The method includes the following actions: providing power to the DUT in a pre-testing stage via a transport frame power supply when the DUT is housed in the transport frame; switching from the transport frame power supply to a test fixture power supply in response to a first power switching signal indicating satisfaction of the pre-testing condition; and switching from the test fixture power supply to the transport frame power supply in response to receiving a second power switching signal indicating completion of the testing stage.

The first power switching signal can include: an indication that the transport frame is inserted in the test fixture and the test fixture power supply is turned on; or an indication that the transport frame is inserted in the test fixture and the test fixture power supply is turned on, and that the DUT is ready for initiation of the testing stage.

The method can include determining whether the pre-testing condition is satisfied. The method can further include initiating the testing stage in response to receiving a test initiation signal indicating the DUT is ready for initiation of the testing stage. The method can include determining whether the DUT is ready for initiation of the testing stage. Determining whether the DUT is ready for initiation of the testing stage can include receiving a determination that current drawn from the DUT is substantially similar to a known targeted idle current of the DUT. The method can further include determining that current drawn from the DUT is substantially similar to a known targeted idle current of the DUT.

The method can further include charging the transport frame power supply.

In another implementation, the present application provides a computer-readable medium storing statements and instructions for execution by a processor to perform a method of power switching in a system for testing a DUT as described herein.

In a further implementation, the present application provides a system for testing a battery-powered electronic device-under-test (DUT). The system includes: a transport frame arranged to receive the DUT; a transport frame power supply arranged to provide power to the DUT in a pre-testing stage; a test fixture arranged to receive the transport frame and to test the DUT when the transport frame is engaged with the test fixture; a test fixture power supply arranged to provide power to the electronic device after satisfaction of a pre-testing condition and in a testing stage; and a switching circuit. The switching circuit is arranged to switch from the transport frame power supply to the test fixture power supply in response to receiving a first power switching signal indicating satisfaction of the pre-testing condition, and arranged to switch from the test fixture power supply to the transport frame power supply in response to receiving a second power switching signal indicating completion of the testing stage.

The transport frame power supply can be provided within the transport frame. The test fixture power supply can be provided within the test fixture. The test fixture further include a charging circuit arranged to charge the test fixture power supply, such as when the transport frame is plugged into test fixture or a special charging cradle.

Two powered-battery emulators can be provided for alternatively plugging into fixture. When one battery emulator is in testing, the other one can boot up DUT first from a real battery on emulator. In a yet further implementation, the present application provides a system for testing first and second battery-powered electronic devices-under-test, including: a first hot emulator arranged to receive the first DUT, the first hot emulator comprising a first battery arranged to provide power to the first DUT in a first pre-testing stage; a second hot emulator arranged to receive the second DUT, the second hot emulator comprising a second battery arranged to provide power to the first DUT in a second pre-testing stage; an external power supply, in electrical communication with the first and second hot emulators, and arranged to provide testing power to the first and second DUTs during first and second testing stages, respectively; and a switching circuit arranged to switch the testing power from the first hot emulator to the second hot emulator to begin the second testing stage in response to receiving a first test completion signal indicating the first DUT has completed the first testing stage.

In an implementation, the present application provides a testing system for testing first and second battery-powered electronic devices-under-test (DUTs). The system includes: first and second transport frames for receiving the first and second DUTs, the first transport frame including a first transport frame power supply and a first switching circuit, and the second transport frame including a second transport frame power supply and a second switching circuit; a test fixture arranged to receive the first and second transport frames and to test the first and second DUTs, respectively, when the first and second transport frames are engaged with the test fixture, the test fixture including a test fixture power supply; and a switching controller in communication with the first and second switching circuits and arranged to generate first and second power switching signals.

The first switching circuit is arranged to switch from the first transport frame power supply to the test fixture power supply in response to receiving a first power switching signal indicating satisfaction of the pre-testing condition, and arranged to switch from the test fixture power supply to the first transport frame power supply in response to receiving a second power switching signal indicating completion of a testing stage for the first DUT. The switching controller is arranged to initiate power switching of power supplied by the test fixture power supply from the first transport frame to the second transport frame to begin a testing stage for the second DUT.

The second switching circuit is arranged to switch from the second transport frame power supply to the test fixture power supply in response to receiving a third power switching signal indicating satisfaction of a second pre-testing condition, and arranged to switch from the test fixture power supply to the second transport frame power supply in response to receiving a fourth power switching signal indicating completion of the testing stage for the second DUT. The switching controller is arranged to generate the third and fourth power switching signals.

In another implementation, the present application provides a method of power switching in a system for testing first and second DUTs, the system including first and second transport frames for receiving the first and second DUTs, respectively, and a test fixture arranged to receive the first and second transport frames and to test the first and second DUTs, respectively, when the first and second transport frames are engaged with the test fixture. The method includes the following actions: providing power to the first DUT in a pre-testing stage via a first transport frame power supply when the DUT is housed in the first transport frame; switching from the first transport frame power supply to a test fixture power supply in response to receiving a first power switching signal indicating satisfaction of a first pre-testing condition; switching from the test fixture power supply to the first transport frame power supply in response to receiving a second power switching signal indicating completion of a testing stage for the first DUT; switching from the second transport frame power supply to a test fixture power supply in response to receiving a third power switching signal indicating satisfaction of a second pre-testing condition; and switching from the test fixture power supply to the second transport frame power supply in response to receiving a fourth power switching signal indicating completion of a testing stage for the second DUT.

FIG. 1 illustrates a block diagram of an apparatus for testing a battery-powered device-under-test in a test fixture according to an implementation of the present application. The apparatus 100 is for testing a DUT 102 using a test fixture 104. The test fixture 104 is arranged to receive the apparatus, or transport frame, and to test the DUT when the apparatus is engaged with the test fixture 104. The test fixture includes a test fixture power supply, or external power supply, 106 arranged to provide power to the DUT in a testing stage. The apparatus 100 can be electrically connected to the test fixture, or test system, 104 via a USB connection.

The apparatus 100 includes a transport frame power supply 108 arranged to provide power to the DUT in a pre-testing stage, or boot up stage. In an implementation, the transport frame power supply 108 comprises a battery.

The apparatus 100 also includes a switching circuit 110 arranged to switch from the transport frame power supply 108 to the test fixture power supply 106 in response to receiving a first power switching signal 112 indicating satisfaction of a pre-testing condition. The pre-testing condition can comprise whether the transport frame is inserted in the test fixture, and the test fixture power supply is turned on. The apparatus can determine whether the DUT 102 is ready for initiation of a testing stage. The testing stage can comprise a current test. The power supply for the DUT 102 is maintained during switching of the power sources. Power is switched from the test fixture power supply 106 to the transport frame power supply 108 in response to receiving a second power switching signal 112A indicating completion of a testing stage.

The term "pre-testing stage" as used herein represents a stage that precedes the testing stage, and during which the pre-testing condition has not yet been satisfied. The transport frame power supply 108 supplies power to the DUT 102 during the pre-testing stage. Power is switched from the transport frame power supply 108 to the test fixture power supply 106 in response to satisfaction of a pre-testing condition. This means that the test fixture power supply 106 can provide power to the DUT 102 after the pre-testing condition has been satisfied and until the DUT is ready for testing, as well as during the actual testing stage. In other words, between the pre-testing stage and the testing stage, there can be an intermediate stage during which the pre-testing condition has been satisfied, but the DUT is not ready for initiation of the testing stage. The transport frame power supply 108 provides power to the DUT during such an intermediate stage.

Rather than switching due to loss of power from a primary power source, implementations of the present application switch power in response to receipt of a first power switching signal 112, which can be generated based on a predetermined condition, or pre-testing condition, being satisfied. For example, the first power switching signal 112 can be generated when the transport frame 100 is electrically engaged, or power engaged, with the test fixture 104 and the test fixture power supply 106 is turned on, regardless of whether the DUT 102 has completed boot up.

A switching controller 114 can control switching from the transport frame power supply 108 to the test fixture power supply 106. The switching controller 114 can generate the first and second power switching signals 112 and 112A received by the switching circuit 110, in response to which power is switched. The first power switching signal 112 can be generated in response to satisfaction of a pre-testing condition. In one implementation, the first power switching signal 112 can be generated in response to manual actuation of a switch enable means by an operator, such manual actuation being the pre-testing condition that is satisfied. The second power switching signal 112A can be generated in response to completion of a testing stage.

The switching circuit 110 can perform an automatic switching between the transport frame power supply 108 and the test fixture power supply 106 in order to obtain or acquire current or voltage measurements for the test.

The switching controller 114 can comprise a machine readable medium storing statements and instructions for execution by a processor to control switching from the transport frame power supply to the test fixture power supply in response to receiving a first power switching signal indicating satisfaction of a pre-testing condition. In an implementation, the processor detects the presence of a transport frame 100 that is engaged with the test fixture 104, and the test fixture power supply 106 is turned on. The switching controller 114 can also determine whether the DUT is ready for initiation of the testing stage. For example, the switching controller can detect a fully booted DUT, such as through current detection or polling for a connection. In an example, the processor then initiates the testing stage. In an implementation, the switching controller 114 is implemented on a personal computer (PC) and comprises a test sequence or test routine, or statements and instructions for performing the test sequence.

The first power switching signal 112 can be generated in response to a positive connection polling result. For example, the switching controller 114, or a test sequence provided therein, can poll the DUT 102 until a positive connection polling result is obtained. In an implementation, a device driver on the PC can poll for a connection. For example, the test sequence in the switching controller 114 can continually request a connection to the DUT 102 from the device driver, or request connection to the first available DUT if there are two or more being tested.

If the device driver is configured to allow for connection polling, then polling can continue until the connection is made, after the device is fully booted, or a timeout condition is reached. One example of such a device driver configuration is that the device driver does not block execution of the test for a long period but returns with a negative response. Alternatively, in a situation in which the device driver blocks execution of the sequence or causes some type of catastrophic error, current detection can be used, and then connection polling. This polling can be performed either internally to the device driver or externally in the test sequence.

The DUT 102 has a different current draw depending on whether the device is booting up, or has completed boot up. The determination of whether the DUT 102 is ready for initiation of the testing stage can be made based on a determination that current drawn from the DUT 102 is stable, or that the current drawn is substantially similar to a known targeted idle current of the DUT, indicating that boot up has been completed and the device is idle. The determination can be made at the switching controller 114, which is preferably in communication with test fixture power supply 106 to detect the current drawn therefrom. For example, in an implementation, the determination can be made by a PC test sequence of the switching controller 114 which is in communication with the test fixture power supply 106 to detect the current drawn. This current detection is performed after the power has been switched to the test fixture power supply 106.

For example, when the transport frame 100, or emulator, is inserted into test fixture 104, a test sequence can switch the power from the transport frame power supply 108, such as a battery, to the power supply 106. After the power switch over, a test sequence can start detecting the current draw from the power supply 106 to determine if the DUT 102 is fully booted up. If the current measurement is around a targeted idle current of the DUT 102, the test sequence can start testing immediately.

In an example, a test sequence in the switching controller 114 polls the power supply 106 at a predetermined interval until the current reaches the idle threshold or until a timeout condition is reached. The test routine can establish a connection to the device and executes the test sequence automatically once the current threshold is met.

According to an implementation of the present application, a battery is provided in the apparatus as the transport frame power supply 108. This allows the device to be powered-up, using the battery 108 in the transport frame 100, prior to its insertion in the test fixture in order to perform the test. The DUT 102 can start testing immediately when the DUT 102 plugs in, instead of waiting for DUT 102 boot-up via the external power supply 106. This can reduce or eliminate the wait time associated with device boot-up time. For example, for a certain model of DUT 102 that was tested for two years, the wait time reduction corresponded to 530 days.

As mentioned earlier, in order to measure the device's current draw, an on-board battery cannot be inserted into the device during the test. The test fixture power supply 106 in conjunction with a switching controller 114 are used to perform a current test, by measuring a drawing current or a sinking current and determining if the device is working properly. An apparatus, or battery emulator, according to an implementation of the present application emulates the on-board battery performance for the purposes of testing. Battery modules often use encryption such that only a particular battery can be used with a given device. As such, a transport frame power supply 108 implemented as a battery can comprise encryption restricting use of the battery to a device model represented by the DUT 102.

In an implementation, the switching circuit 110 is arranged to switch power from the battery to the power supply while minimizing an interruption in current flow or a change in the voltage, and avoiding a loss of connection. If there is a large enough hiccup in the level of power supply, the DUT 102 will reboot. In an implementation, the switch from the transport frame power supply to the test fixture power supply causes a voltage drop, and the switching circuit 110 is arranged such that the voltage drop is below a reboot tolerance for the DUT 102.

The tolerance in the switching is related to the device's tolerance for rebooting. In an exemplary device, a voltage below 2.5 volts for several milliseconds will trigger a reboot. Components or elements of the switching circuit 110, and optionally the switching controller 114, are selected in order to achieve a voltage drop that is below the DUT's reboot tolerance. For devices with different tolerances, the switching circuit 110, and optionally the switching controller 114, can be modified accordingly, as is evident to one of ordinary skill in the art.

While functionality is described above and in examples as being performed by the switching controller 114, the switching controller functionality can alternatively be performed by any other processor, computer or device in communication with the test fixture 104 and the DUT 102.

In an implementation, the switching controller 114 itself can be provided outside of the test fixture 104, such as in the transport frame 100 or in a separate device or apparatus. The location of the switching controller 114, or switching controller functionality, can be anywhere that the switching controller is able to determine the inputs and outputs of the system, such as having access to data from the power supply 106 of the test fixture 104.

For example, if current is not being measured with the power supply, and rather using a current meter on the transport frame 100, the switching controller 114 can be provided on the transport frame 100. In that case, the power supply measurement can be taken externally from the transport frame 100. As long as there is a manner in which current and voltage can be measured on the transport frame 100, such as using a microcontroller provided on the transport frame 100, the determination can be made on the transport frame 100 and power switching can be performed accordingly.

Figure 2:
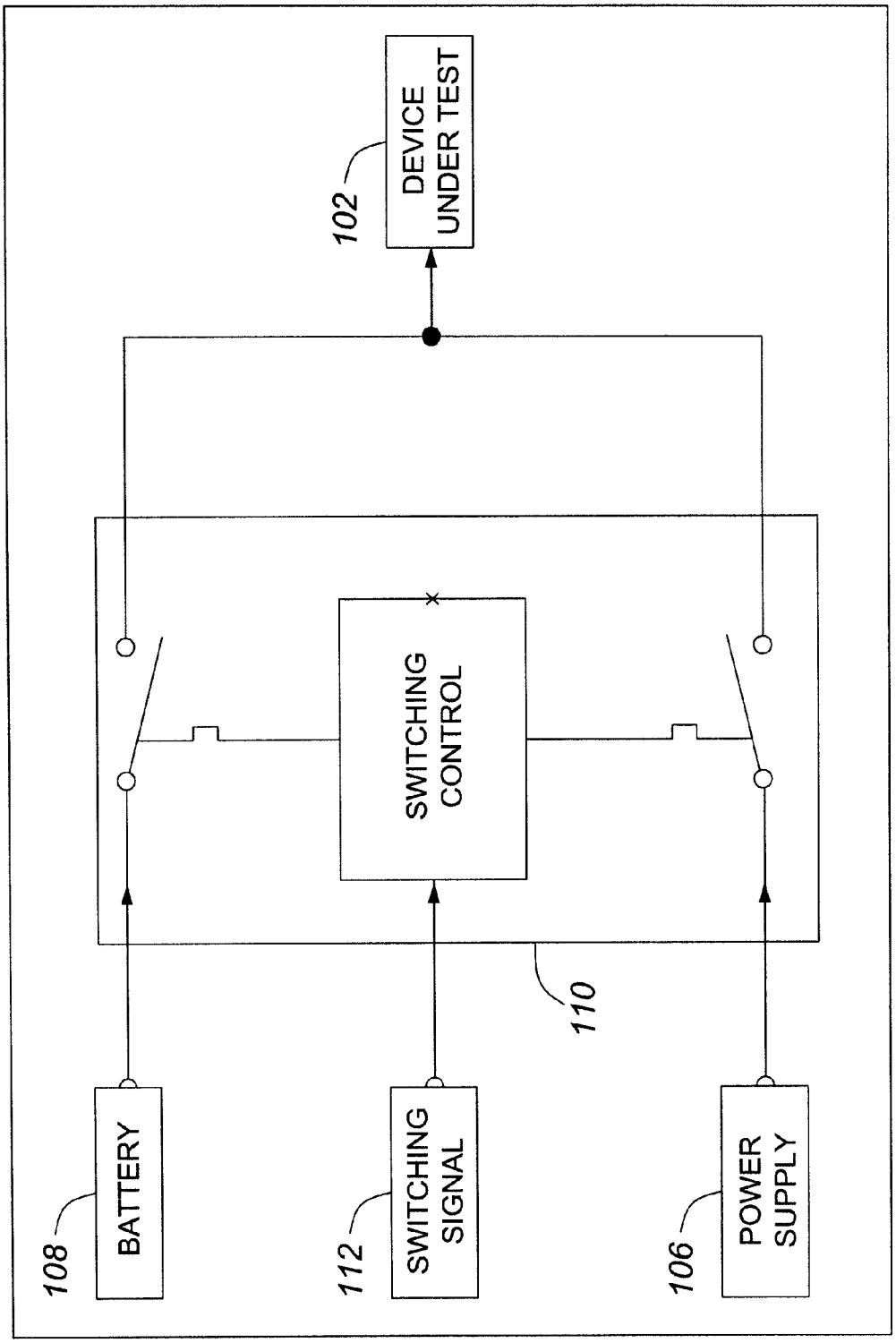
FIG. 2 illustrates a block and circuit diagram of an apparatus for testing a battery-powered device-under-test in a test fixture according to another implementation of the present application.

FIG. 2 illustrates a block and circuit diagram of an apparatus for testing a DUT in a test fixture according to another implementation of the present application. The implementation in FIG. 2 is similar to the implementation in FIG. 1, and shows the apparatus in isolation from the test fixture 104. In this example, the transport frame power supply 108 is implemented as a battery. The switching circuit 110 receives the switching signal 112 and power from the battery 108 and the test fixture power supply 106.

An implementation of the present application includes: a battery; a means for switching the power source of the device from the battery to an external power supply, such as provided by a base plate or test fixture; and a means for verifying that the device has fully turned on when the transport frame is connected with the base plate.

Figure 3:
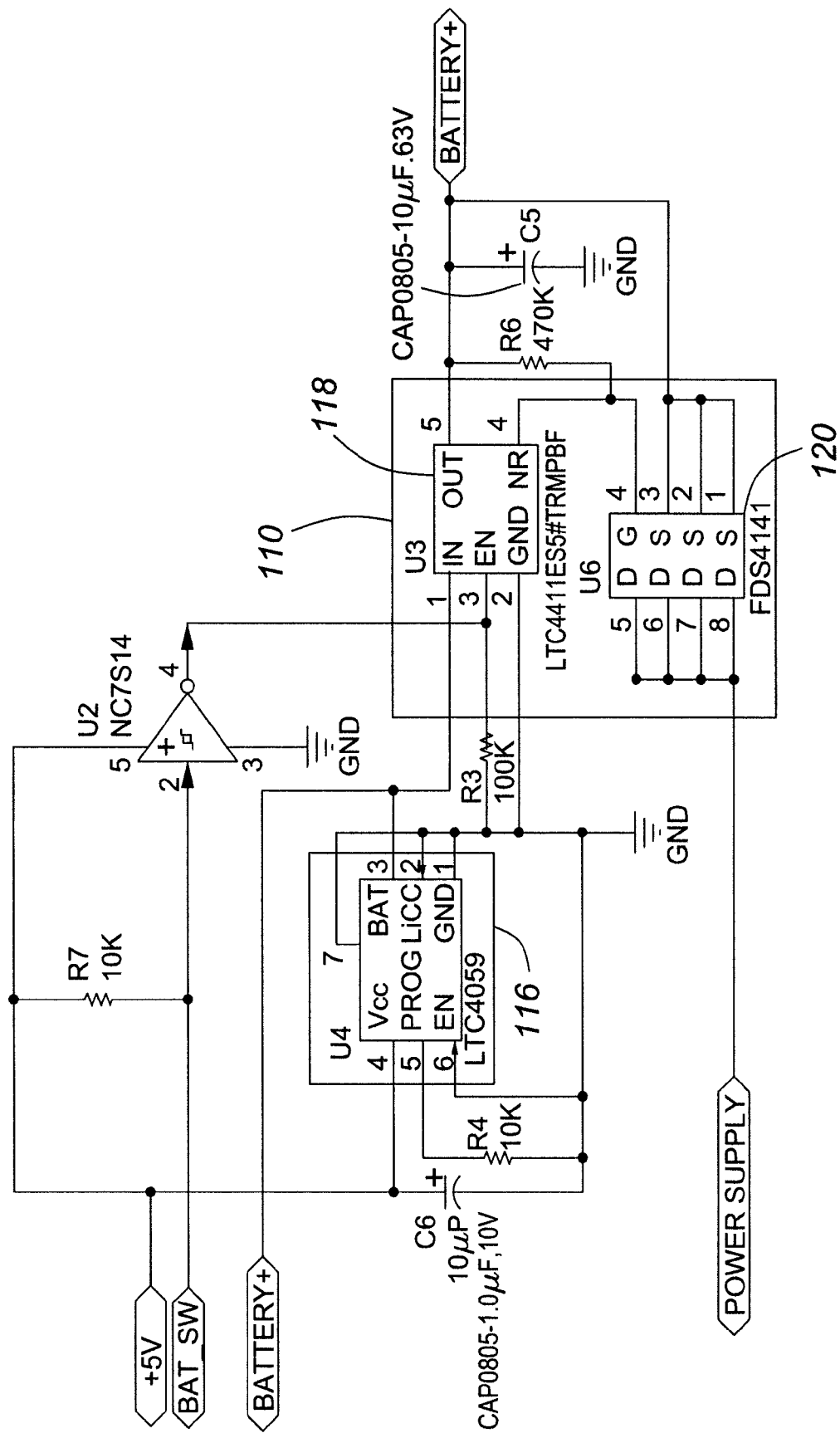
FIG. 3 illustrates an electrical circuit diagram of a switching circuit on a transport frame for testing a DUT according to an implementation.

FIG. 3 illustrates an electrical circuit diagram of the switching circuit 110 on a transport frame 100 according to an implementation. In FIG. 3, a particular implementation is shown in detail, in which the transport frame power supply is a battery. The switching circuit 110 in FIG. 3 can perform power switching without a drop in power that would trigger a reboot. Using implementations described herein, the voltage drop is very small and the power can be switched back and forth between the battery 108 and the power supply 106.

In FIG. 3, a charging circuit 116 is arranged to charge the battery in the transport frame. The charging circuit can provide charging current for a real battery on the transport frame, or emulator, to extend battery lifetime on the transport frame. The charging circuit 116 can be turned on only when the + fixture power is connected, for example, +5 V when transport frame 100 is inserted into test fixture 104. Providing the charging circuit 116 gives an advantage that the battery need not be replaced frequently. The charging circuit 116 can be provided in the test fixture.

In FIG. 3, the switching circuit 110 can switch between the battery 108 and the power supply 106 and isolate the two from each other. In an implementation, the switching circuit 110 comprises an ideal diode 118 arranged to electrically isolate the transport frame power supply from the test fixture power supply.

The switching circuit 110 can comprise a load switch 120 having low static Drain to Source on resistance, which has substantially no impact on current measurement for DUT test.

The load switch 120 can comprise a metal oxide semiconductor field effect transistor (MOSFET), power MOS device or power FET. The load switch 120 has a small switch-over voltage loss and can be a p-channel MOSFET. The load switch 120 also works well as an isolating switch since the power consumption is very low, and the load switch 120 prevents backup current to the test fixture power supply 106. When turning on the device, the voltage of battery 108 can be about 4.2 volts, which is higher than the voltage of the power supply 106 of 3.8 volts. In that case, current can flow from the battery 108 to the test fixture power supply 106, which is undesirable. Therefore, the load switch 120 isolates the battery 108 from the test fixture power supply 106 to prevent current leakage there between. The load switch 120 can enable the switching circuit 110 to carry out a method of instantaneously switching the device's power source from a battery 108 in the test module to the external power supply 106.

Alternatives to using a load switch 120 include a basic switch, or a diode connected to both the battery and the power supply. In some cases, the use of a diode in the fixture can trigger a power supply protection fault because some of the battery voltage trickles over to the power supply. Also, using a diode for switching has the drawback of a 0.7 V drop across a diode, meaning that the diode may not work for the purposes desired.

An advantage of using a load switch for switching is that the load switch is better than using relay-capacitor combination, since relays get worn out, have bigger metal parts and the combination alters the radiated RF characteristics of the DUT, leading to inaccurate RF measurements. A load switch has low static Drain to Source on resistance, which has substantially no impact on current measurement for device test.

Figure 4:
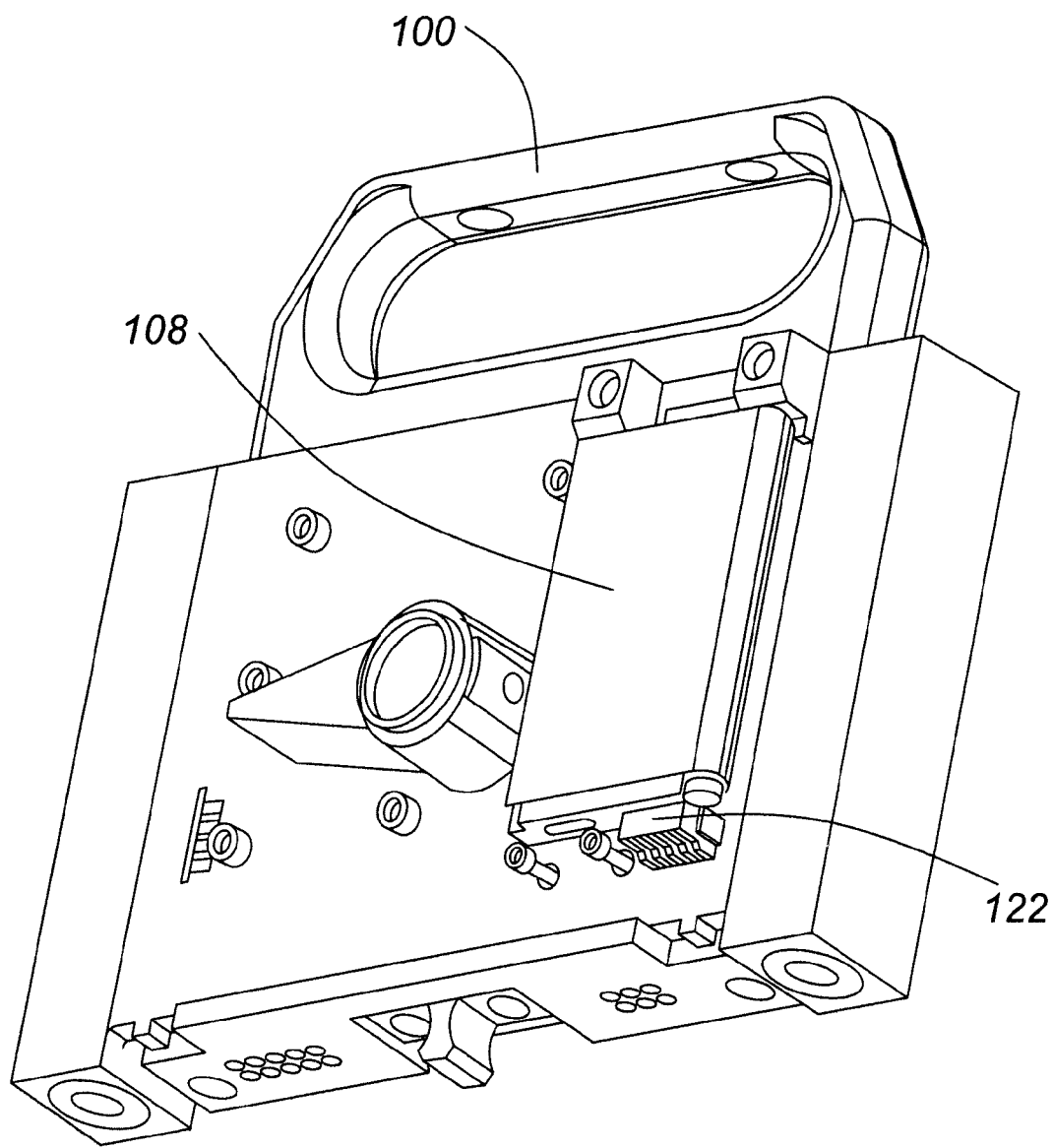
FIG. 4 illustrates front perspective view of a transport frame for testing a DUT according to an implementation of the present application.

FIG. 4 illustrates front perspective view of a transport frame for testing a DUT according to an implementation of the present application. This figure illustrates an example of a visual representation of a transport frame 100, and the location of a transport frame power supply 108, or battery, in a position distinct from the location in which the DUT is placed (on the opposite side not shown in FIG. 4). The battery 108 can have an associated connector 122 to connect with circuitry on the transport frame 100.

According to an implementation described herein, even when the transport frame 100 is not attached with a base plate or test fixture 104, the DUT can receive power from the transport frame power supply 108. So, a device resting in the transport frame can be turned on even when the transport frame is not attached with the base plate or test fixture, and permit boot up prior to testing, such that the device will not require a reboot after power switching.

An example implementation of the present application includes four components, in addition to the primary components described earlier: 1) Load Switch 120. The present application includes a means for switching the power source of the device from the transport-frame battery 108 to the base plate. This maintains power supply for the device during power switching by using a Load Switch 120 for power switching between a real battery 108 and test fixture power supply 106; 2) An ideal diode 118 is connected between battery 108 and Load Switch 120 to prevent backward current from power supply. The ideal diode 118 has very low voltage drop and Forward-on-Resistance across the ideal diode 118 during normal operation. 3) To extend battery lifetime on transport frame, a charging circuit 116 provides charging current for real battery 108. 4) A means for verifying that the device is turned on and fully booted up. The means comprises monitoring the current drawn through the base plate from test fixture power supply 106, after power has been switched thereto, and detecting a current which is below a predetermined current threshold. Once the current is detected to be below the threshold then the test sequence is automatically started.

Figure 5:
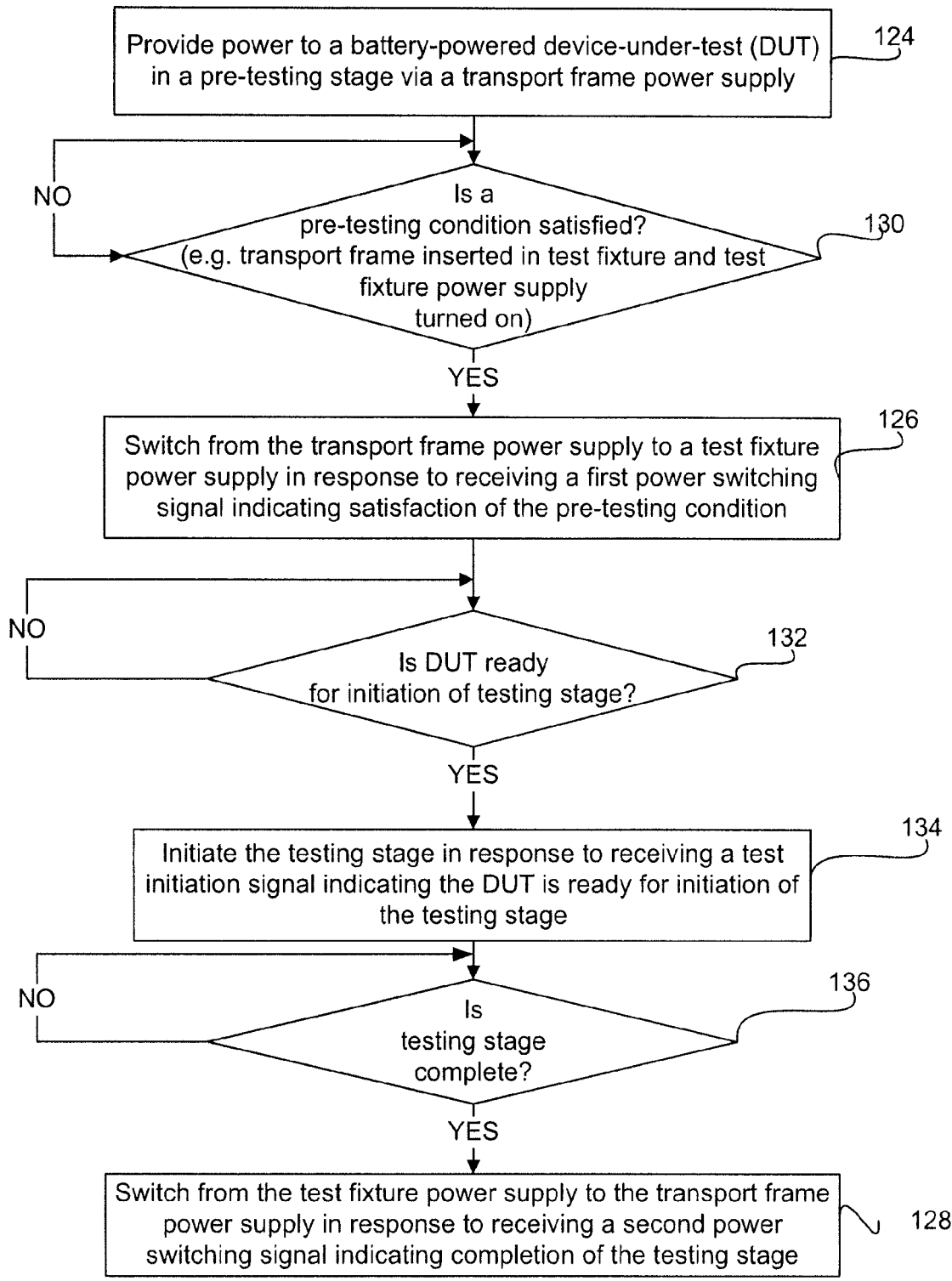
FIG. 5 is a flowchart illustrating a method of power switching in a system for testing a DUT according to an implementation of the present application.

FIG. 5 is a flowchart illustrating a method of power switching in a system for testing a DUT according to an implementation of the present application. The system can include a transport frame 100 and a test fixture 104 arranged to receive the transport frame 100 and to test the DUT 102 when the transport frame 100 is engaged with the test fixture 104. The method comprises: providing power to the DUT in a pre-testing stage via a transport frame power supply 108 when the DUT 102 is housed in the transport frame 100 (action 124); switching from the transport frame power supply 108 to a test fixture power supply 106 in response to receiving a first power switching signal indicating satisfaction of a pre-testing condition (action 126); and switching from the test fixture power supply to the transport frame power supply in response to receiving a second power switching signal indicating completion of a testing stage (action 128).

The method can include determining whether the pre-testing condition is satisfied (action 130). This action 130 can be performed after action 124. For example, action 130 can include determining whether the transport frame is inserted in the test fixture, and the test fixture power supply is turned on.

The method can further include determining whether the DUT is ready for initiation of the testing stage (action 132). Such determination can be made on the basis of whether the current drawn from the DUT is substantially similar to a known targeted idle current of the DUT. For example, action 132 can include receiving a determination that current drawn from the DUT 102 is substantially similar to a known targeted idle current of the DUT. Action 132 is performed after action 126, since the current can be read or determined from the test fixture power supply 106 only after power is switched to the test fixture power supply 106 in action 126.

The method in FIG. 5 can include initiating the testing stage in response to receiving a test initiation signal indicating the DUT is ready for initiation of the testing stage (action 134). The action 134 is performed after action 132, and the test initiation signal can be generated based on the determination in action 132. The method can also include determining whether the testing stage is complete (action 136). The action 136 is performed after the action 134, and the second power switching signal received in action 128 can be generated based on the determination in action 136.

Figure 6:
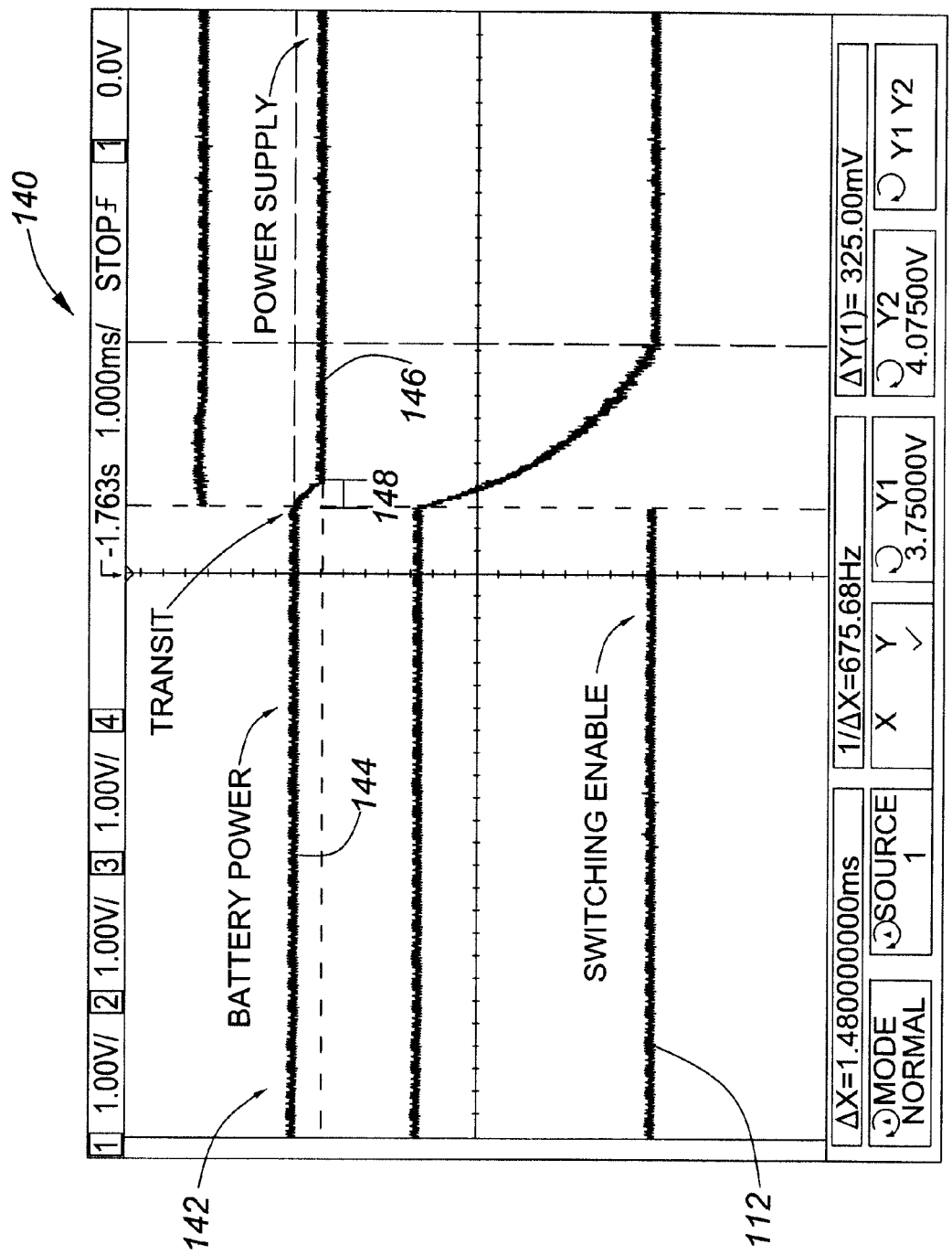
FIG. 6 illustrates a graphical plot of power usage in a DUT according to an implementation of the present application.

FIG. 6 illustrates an exemplary graphical plot, 140 generated by an oscilloscope, of power usage in a DUT according to an implementation of the present application. The power used by the DUT is shown on the plot as a DUT power usage signal 142. A first portion 144 of the DUT power usage signal 142 represents the power applied to the DUT using the transport frame power supply 108. When the switching signal 112, or switch enable signal, changes from LOW TO HIGH, power applied to the DUT is changed from the transport frame power supply 108 to the test fixture power supply 106. The resulting power applied is shown in a second portion 146 of the displayed DUT power usage signal 142. The voltage level provided to the DUT is changed from 4.1V in the first portion 144 to 3.8V in the second portion 146. A transition period 148 can be about 0.3 milliseconds, as shown in the plot from oscilloscope in FIG. 6.

When testing products in a production line, each separate product can have at least one production line. Each production line can have about 10-30 test fixtures. In an implementation, more than one transport frame, or hot emulator, can advantageously be provided for each station. The description below will discuss having two transport frames. In an exemplary operation in which the test time is 6 seconds and the device boot-up time is 10 seconds, 3 or 4 transport frames can advantageously be used with each test fixture.

In an implementation, the present application provides a system for testing first and second battery-powered electronic DUTs, including a first hot emulator arranged to receive the first DUT, and a second hot emulator arranged to receive the second DUT. The first hot emulator comprises a first battery arranged to provide power to the first DUT in a first pre-testing stage. The second hot emulator comprises a second battery arranged to provide power to the first DUT in a second pre-testing stage. An external power supply is provided, in electrical communication with the first and second hot emulators, and arranged to provide testing power to the first and second DUTs during first and second testing stages, respectively. A switching circuit is arranged to switch the testing power from the first hot emulator to the second hot emulator to begin the second testing stage in response to receiving a first test completion signal indicating the first DUT has completed the first testing stage.

Figure 7:
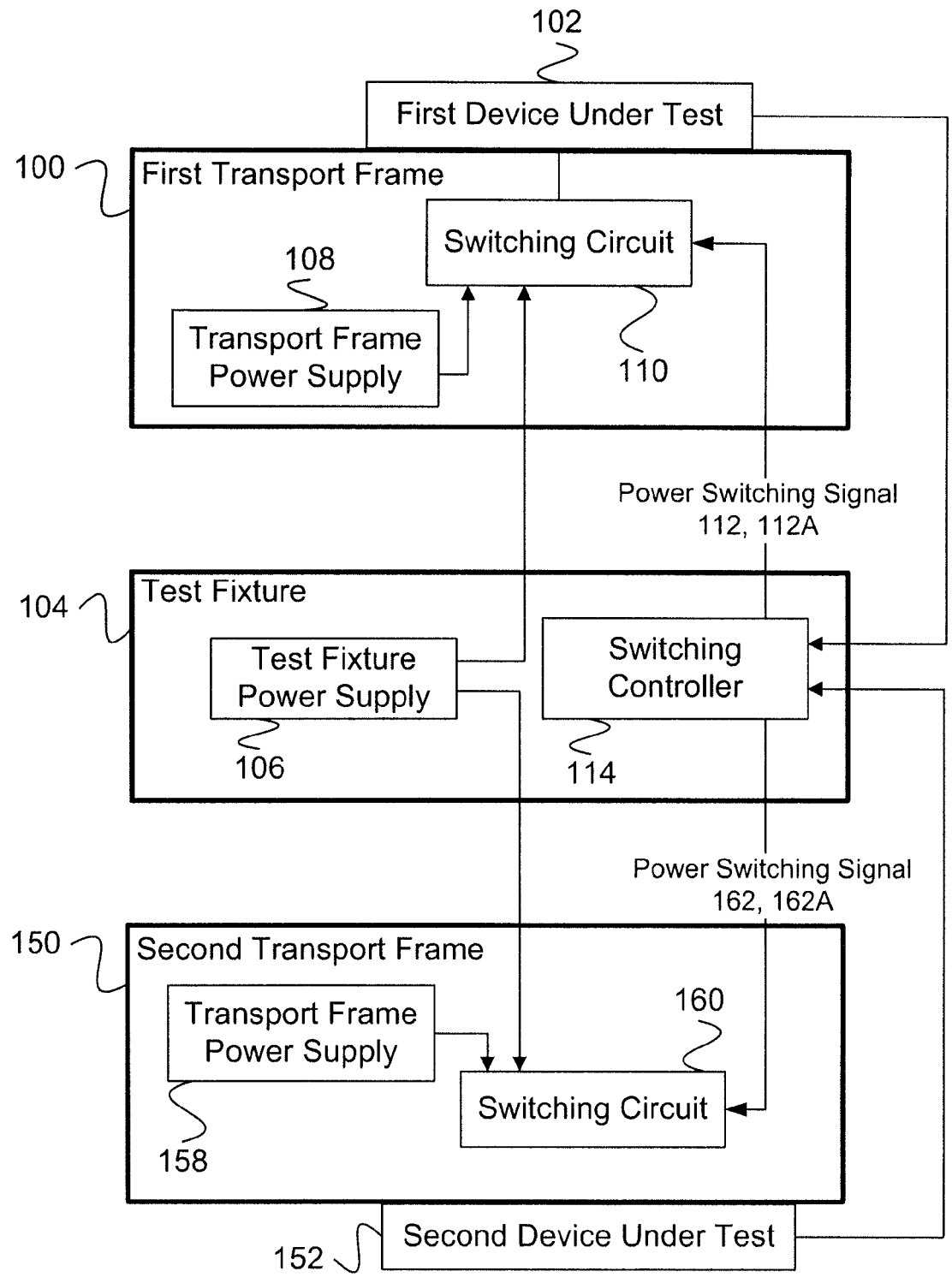
FIG. 7 illustrates a block diagram of a system for testing first and second DUTs according to an implementation of the present application.

FIG. 7 illustrates a block diagram of a system for testing first and second DUTs according to an implementation of the present application. The system includes first and second transport frames 100 and 130 for receiving the first and second DUTs 102 and 152, respectively. The test fixture 104 of FIG. 7 is arranged to receive the first and second transport frames 100 and 150 and to test the first and second DUTs 102 and 152, respectively, when the first and second transport frames are engaged with the test fixture 104. The test fixture 104 includes a test fixture power supply 106.

The first transport frame 100 includes a first transport frame power supply 108 and a first switching circuit 110. The second transport frame 150 includes a second transport frame power supply 158 and a second switching circuit 160.

A switching controller 114, in communication with the first and second switching circuits 110 and 160, is arranged to generate first and second power switching signals 112 and 112A, and third and further power switching signals 162 and 162A, respectively. The switching controller 114 is also arranged to initiate power switching of power supplied by the test fixture power supply 106 from the first transport frame 100 to the second transport frame 150 to begin the second testing stage.

The first switching circuit 110 is arranged to switch from the first transport frame power supply 108 to the test fixture power supply 106 in response to receiving a first power switching signal 112 indicating satisfaction of the pre-testing condition, and arranged to switch from the test fixture power supply 106 to the first transport frame power supply 108 in response to receiving a second power switching signal indicating completion of a testing stage for the first DUT 102.

The second switching circuit 160 is arranged to switch from the second transport frame power supply 158 to the test fixture power supply 106 in response to receiving the second power switching signal 162.

While the switching controller 114 is shown in FIG. 7 to be provided within the test fixture, the switching controller 114 can be provided in any other element of the test system, provided the other element has the appropriate electrical connections and ability to receive and generate inputs and outputs. Also, while functionality is described above and in examples as being performed by the switching controller 114, the switching controller functionality can alternatively be performed by any other processor, computer or device in communication with the test fixture 104 and the DUTs 102 and 152.

Figure 8:
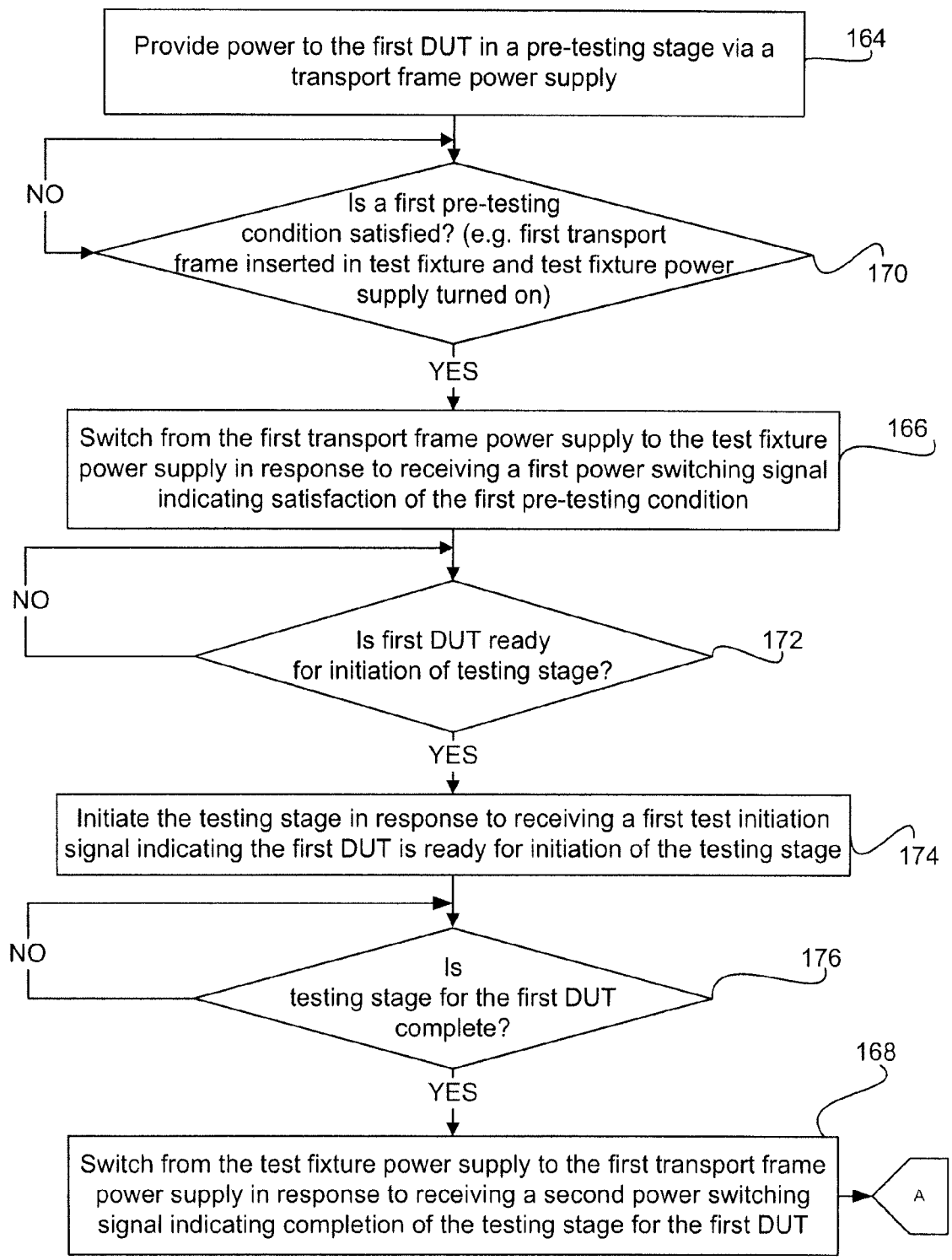
FIGS. 8 and 9 are flowcharts illustrating a method of power switching in a system for testing first and second DUTs according to an implementation of the present application.
Figure 9:
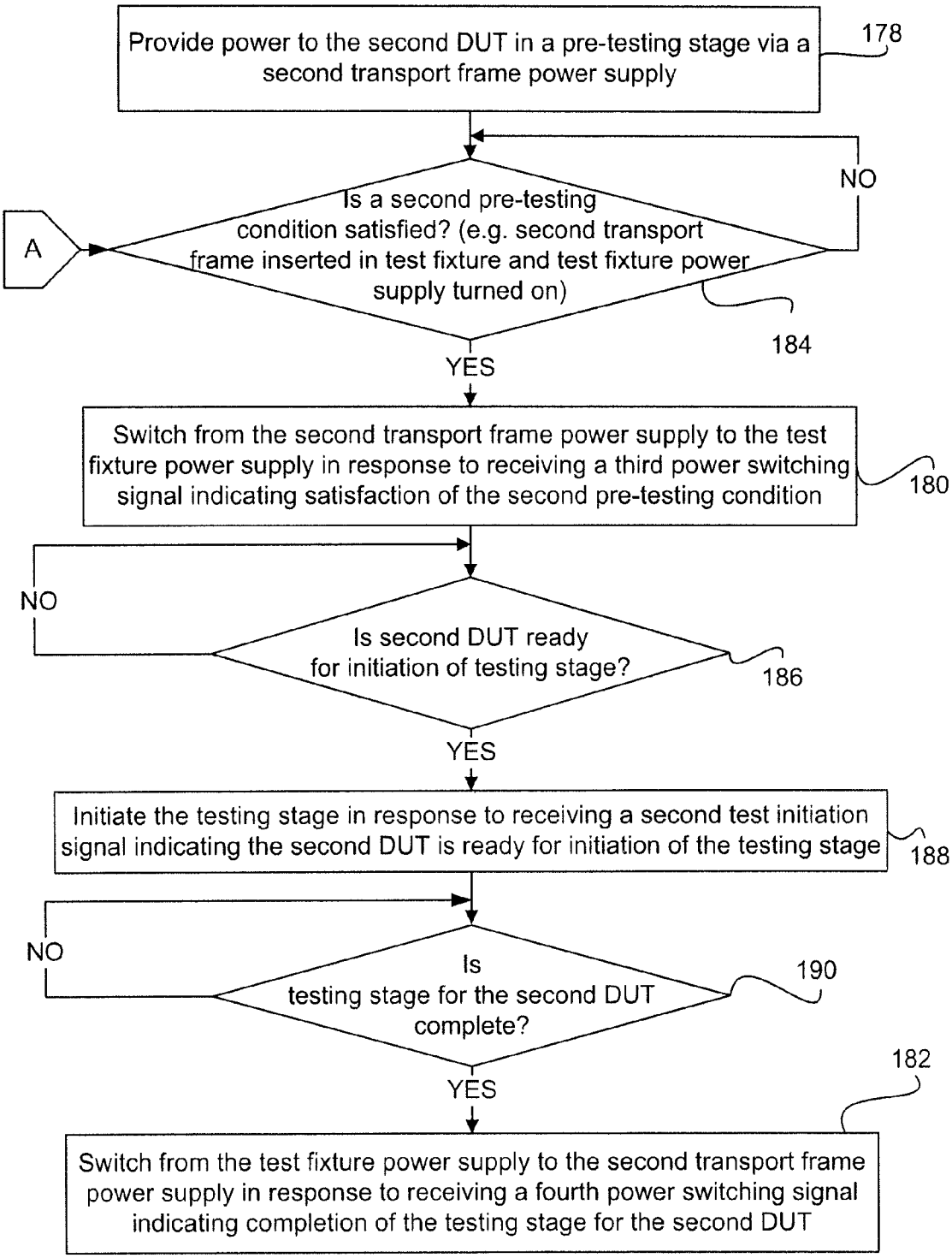

FIGS. 8 and 9 are flowcharts illustrating a method of power switching in a system for testing first and second DUTs according to an implementation of the present application. The system includes first and second transport frames 100 and 150 for receiving the first and second DUTs 102 and 152, respectively, and a test fixture 104 arranged to receive the first and second transport frames 100 and 150 and to test the first and second DUTs 102 and 152, respectively, when the first and second transport frames 100 and 150 are engaged with the test fixture 104.

The method in FIG. 8 comprises: providing power to the first DUT 102 in a pre-testing stage via a first transport frame power supply 108 when the DUT 102 is housed in the first transport frame 100 (action 164); switching from the first transport frame power supply 108 to a test fixture power supply 106 in response to receiving a first power switching signal indicating satisfaction of a first pre-testing condition (action 166); and switching from the test fixture power supply 106 to the first transport frame power supply 108 in response to receiving a second power switching signal indicating completion of a testing stage for the first DUT (action 168).

The method can include determining whether the first pre-testing condition is satisfied (action 170). This action 170 can be performed after action 164. For example, action 170 can include determining whether the first transport frame is inserted in the test fixture, and the test fixture power supply is turned on.

The method can further include determining whether the first DUT is ready for initiation of the testing stage (action 172). Such determination can be made on the basis of whether the current drawn from the first DUT is substantially similar to a known targeted idle current of the first DUT. For example, action 172 can include receiving a determination that current drawn from the first DUT 102 is substantially similar to a known targeted idle current of the first DUT. Action 172 is performed after action 166, since the current from the test fixture power supply 106 can be read or determined only after power is switched to the test fixture power supply 106 in action 166.

The method in FIG. 8 can include initiating the testing stage for the first DUT in response to receiving a first test initiation signal indicating the first DUT is ready for initiation of the testing stage (action 174). The action 174 is performed after action 172, and the first test initiation signal can be generated based on the determination in action 172. The method can also include determining whether the testing stage for the first DUT is complete (action 176). The action 176 is performed after the action 174, and the second power switching signal received in action 168 can be generated based on the determination in action 176.

After completion of action 168 in FIG. 8, the method proceeds to FIG. 9. The actions in FIG. 9 are similar to those in FIG. 8, and relate primarily to the second DUT 152. Action 178 of providing power to the second DUT 152 in a pre-testing stage via a second transport frame power supply 158 can already be in process before the method proceeds from action 168 in FIG. 8.

The method in FIG. 9 comprises: switching from the second transport frame power supply 158 to a test fixture power supply 106 in response to receiving a third power switching signal indicating satisfaction of a second pre-testing condition (action 180); and switching from the test fixture power supply 106 to the second transport frame power supply 158 in response to receiving a fourth power switching signal indicating completion of a testing stage for the second DUT 152 (action 182).

The method can include determining whether the first pre-testing condition is satisfied (action 184). This action 184 can be performed after action 178 and after completion of action 168 in FIG. 8. For example, action 184 can include determining whether the second transport frame is inserted in the test fixture, and the test fixture power supply is turned on.

The method can further include determining whether the second DUT is ready for initiation of the testing stage (action 186). Such determination can be made on the basis of whether the current drawn from the second DUT is substantially similar to a known targeted idle current of the second DUT. For example, action 186 can include receiving a determination that current drawn from the second DUT 152 is substantially similar to a known targeted idle current of the second DUT. Action 186 is performed after action 180, since the current from the test fixture power supply 106 can be read or determined only after power is switched to the test fixture power supply 106 in action 180.

The method in FIG. 9 can include initiating the testing stage for the second DUT in response to receiving a second test initiation signal indicating the second DUT is ready for initiation of the testing stage (action 188). The action 188 is performed after action 186, and the second test initiation signal can be generated based on the determination in action 186. The method can also include determining whether the testing stage for the second DUT is complete (action 190). The action 190 is performed after the action 188, and the fourth power switching signal received in action 182 can be generated based on the determination in action 190.

Figure 10:
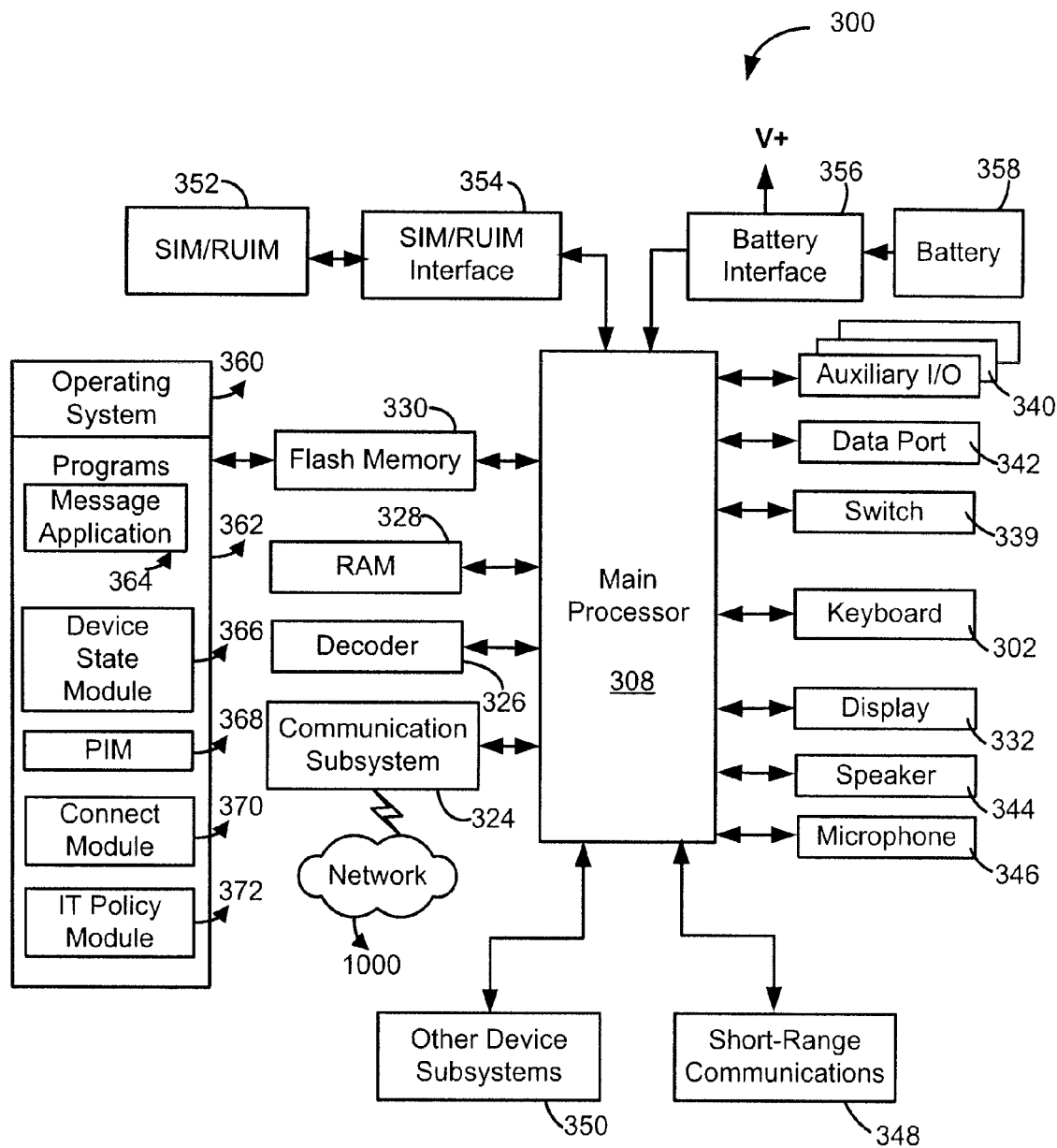
FIG. 10 is a block diagram of a mobile electronic device according to one example.

FIG. 10 is a block diagram of the mobile electronic device according to one example. The following describes in further detail an exemplary mobile electronic device that can include a processor, and a computer readable memory in communication with the processor. In an implementation, the memory can store statements and instructions for execution by the processor to identify an intended hard key activation in response to receiving an indication of connection of a key circuit and based on one or more detected capacitance levels, as described and illustrated in the present application. The mobile electronic device may be a two-way communication device with advanced data communication capabilities including the capability to communicate with other mobile electronic devices or computer systems through a network of transceiver stations. The mobile electronic device may also have the capability to allow voice communication. Depending on the functionality provided by the mobile electronic device, the device may be referred to as a data messaging device, a two-way pager, a cellular telephone with data messaging capabilities, a wireless Internet appliance, or a data communication device (with or without telephony capabilities). The mobile electronic device may also be a mobile electronic device without wireless communication capabilities as a handheld electronic game device, digital photograph album, digital camera and the like.

Referring to FIG. 10, there is shown therein a block diagram of an exemplary implementation of the mobile electronic device 300. The mobile electronic device 300 includes a number of components such as a processor 308 that controls the overall operation of the mobile electronic device 300. Communication functions, including data and voice communications, are performed through a communication subsystem 324. Data received by the mobile electronic device 300 can be decompressed and decrypted by a decoder 326, operating according to any suitable decompression techniques (e.g. YK decompression, and other known techniques) and encryption techniques (e.g. using an encryption technique such as Data Encryption Standard (DES), Triple DES, or Advanced Encryption Standard (AES)). The communication subsystem 324 receives messages from and sends messages to a wireless network 1000. In this exemplary implementation of the mobile electronic device 300, the communication subsystem 324 is configured in accordance with the Global System for Mobile Communication (GSM) and General Packet Radio Services (GPRS) standards. The GSM/GPRS wireless network is used worldwide. New standards such as Enhanced Data GSM Environment (EDGE) and Universal Mobile Telecommunications Service (UMTS) are believed to have similarities to the network behavior described herein, and persons skilled in the art will understand that the implementations described herein are intended to use any other suitable standards that are developed in the future. The wireless link connecting the communication subsystem 324 with the wireless network 1000 represents one or more different Radio Frequency (RF) channels, operating according to defined protocols specified for GSM/GPRS communications. With newer network protocols, these channels are capable of supporting both circuit switched voice communications and packet switched data communications.

Although the wireless network 1000 associated with the mobile electronic device 300 is a GSM/GPRS wireless network in one exemplary implementation, other wireless networks may also be associated with the mobile electronic device 300 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA1000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems. The processor 308 also interacts with additional subsystems such as a Random Access Memory (RAM) 328, a flash memory 330, a display 332, the keyboard 302, a switch 339, an auxiliary input/output (I/O) subsystem 340, a data port 342, a speaker 344, a microphone 346, short-range communications 348, and other device subsystems 350. The flash memory 330 and RAM 328 are examples of a computer readable memory in communication with the processor 308. The memory can store statements and instructions for execution by the processor to perform the method of identifying an intended hard key activation in response to receiving an indication of connection of a key circuit and based on one or more detected capacitance levels, as described and illustrated in the present application.

Some of the subsystems of the mobile electronic device 300 perform communication-related functions, whereas other subsystems may provide "resident" or on-device functions. By way of example, the keyboard 302 may be used for both communication-related functions, such as entering a text message for transmission over the network 1000, and device-resident functions such as a calculator or task list.

The mobile electronic device 300 can send and receive communication signals over the wireless network 1000 after network registration or activation procedures have been completed. Network access is associated with a subscriber or user of the mobile electronic device 300. To identify a subscriber according to the present implementation, the mobile electronic device 300 uses a SIM/RUIM card 352 (i.e. Subscriber Identity Module or a Removable User Identity Module) inserted into a SIM/RUIM interface 354 for communication with a network such as the network 1000. The SIM/RUIM card 352 is one type of a conventional "smart card" that can be used to identify a subscriber of the mobile electronic device 300 and to personalize the mobile electronic device 300, among other things. In the present implementation the mobile electronic device 300 is not fully operational for communication with the wireless network 1000 without the SIM/RUIM card 352. By inserting the SIM/RUIM card 352 into the SIM/RUIM interface 354, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. The SIM/RUIM card 352 includes a processor and memory for storing information. Once the SIM/RUIM card 352 is inserted into the SIM/RUIM interface 354, the SIM/RUIM card 352 is coupled to the processor 308. In order to identify the subscriber, the SIM/RUIM card 352 can include some user parameters such as an International Mobile Subscriber Identity (IMSI). An advantage of using the SIM/RUIM card 352 is that a subscriber is not necessarily bound by any single physical mobile electronic device. The SIM/RUIM card 352 may store additional subscriber information for a mobile electronic device as well, including datebook (or calendar) information and recent call information. Alternatively, user identification information can also be programmed into the flash memory 330. The mobile electronic device 300 can also be enabled to receive additional memory cards. For example, memory card slots (not shown) can be provided in the mobile electronic device 300 to receive such cards.

The mobile electronic device 300 is a battery-powered device and includes a battery interface 356 for receiving a battery pack containing one or more rechargeable battery cells 358, and associated control circuitry (not shown) that, in some implementations, can interface with the battery interface 356. The battery pack has a form factor and contact arrangement suited to the particular mobile electronic device. In at least some implementations, the battery 358 can be a smart battery with an embedded microprocessor. The battery interface 356 is coupled to a regulator (not shown), which assists the battery 358 in providing power V+ to the mobile electronic device 300. Although current technology makes use of a battery, future technologies such as micro fuel cells may provide the power to the mobile electronic device 300.

The mobile electronic device 300 also includes an operating system 360 and software components 362 which are described in more detail below. The operating system 360 and the software components 362 that are executed by the processor 308 are typically stored in a persistent store such as the flash memory 330, which may alternatively be a read-only memory (ROM) or similar storage element (not shown). Those skilled in the art will appreciate that portions of the operating system 360 and the software components 362, such as specific software applications 364, 366, 368, 370 and 372, or parts thereof, may be temporarily loaded into a volatile store such as the RAM 328. Other software components can also be included, as is well known to those skilled in the art.

The subset of software components 362 that control basic device operations, including data and voice communication applications, will normally be installed on the mobile electronic device 320 during its manufacture. Other software applications include a message application 364 that can be any suitable software program that allows a user of the mobile electronic device 300 to send and receive electronic messages. Various alternatives exist for the message application 364 as is well known to those skilled in the art. Messages that have been sent or received by the user are typically stored in the flash memory 330 of the mobile electronic device 300 or some other suitable storage element in the mobile electronic device 300. In at least some implementations, some of the sent and received messages may be stored remotely from the device 300 such as in a data store of an associated host system that the mobile electronic device 300 communicates with.

The software components 362 can further include a device state module 366, a Personal Information Manager (PIM) 368, and other suitable modules (not shown). The device state module 366 provides persistence, i.e. the device state module 366 ensures that important device data is stored in persistent memory, such as the flash memory 330, so that the data is not lost when the mobile electronic device 300 is turned off or loses power.

The PIM 368 includes functionality for organizing and managing data items of interest to the user, such as, but not limited to, e-mail, contacts, calendar events, voice mails, appointments, and task items. The PIM 368 has the ability to send and receive data items via the wireless network 1000. PIM data items may be seamlessly integrated, synchronized, and updated via the wireless network 1000 with the mobile electronic device subscriber's corresponding data items stored or associated, or both, with a host computer system. This functionality creates a mirrored host computer on the mobile electronic device 330 with respect to such items. This can be particularly advantageous when the host computer system is the mobile electronic device subscriber's office computer system.

The software components 362 also include a connect module 370, and an information technology (IT) policy module 372. The connect module 370 implements the communication protocols that are required for the mobile electronic device 300 to communicate with the wireless infrastructure and any host system, such as an enterprise system, that the mobile electronic device 300 is authorized to interface with.

The connect module 370 includes a set of APIs that can be integrated with the mobile electronic device 300 to allow the mobile electronic device 300 to use any number of services associated with the enterprise system. The connect module 370 allows the mobile electronic device 300 to establish an end-to-end secure, authenticated communication pipe with the host system. A subset of applications for which access is provided by the connect module 370 can be used to pass IT policy commands from the host system to the mobile electronic device 300. This can be done in a wireless or wired manner. These instructions can then be passed to the IT policy module 372 to modify the configuration of the device 300. Alternatively, in some cases, the IT policy update can also be done over a wired connection.

Other types of software applications can also be installed on the mobile electronic device 300. These software applications can be third party applications, which are added after the manufacture of the mobile electronic device 300. Examples of third party applications include games, calculators, utilities, etc.

The additional applications can be loaded onto the mobile electronic device 300 through at least one of the wireless network 1000, the auxiliary I/O subsystem 340, the data port 342, the short-range communications subsystem 248, or any other suitable device subsystem 350. This flexibility in application installation increases the functionality of the mobile electronic device 300 and may provide enhanced on-device functions, communication-related functions, or both. For example, secure communication applications may enable electronic commerce functions and other such financial transactions to be performed using the mobile electronic device 300.

The data port 342 enables a subscriber to set preferences through an external device or software application and extends the capabilities of the mobile electronic device 300 by providing for information or software downloads to the mobile electronic device 300 other than through a wireless communication network. The alternate download path may, for example, be used to load an encryption key onto the mobile electronic device 300 through a direct and thus reliable and trusted connection to provide secure device communication.

The data port 342 can be any suitable port that enables data communication between the mobile electronic device 300 and another computing device. The data port 342 can be a serial or a parallel port. In some instances, the data port 342 can be a USB port that includes data lines for data transfer and a supply line that can provide a charging current to charge the battery 358 of the mobile electronic device 300.

The short-range communications subsystem 348 provides for communication between the mobile electronic device 300 and different systems or devices, without the use of the wireless network 1000. For example, the short-range communications subsystem 348 may include an infrared device and associated circuits and components for short-range communication. Examples of short-range communication standards include standards developed by the Infrared Data Association (IrDA), Bluetooth, and the 802.11 family of standards developed by IEEE.

Synchronization of files and data between the mobile electronic device 300 and another computing device can be achieved over the wireless network 1000, through the short-range communications system 348, or through a direct connection between the data port 342 of the mobile electronic device 300 and the other computing device. Synchronization causes the most recent version of files and data to be mirrored on either the mobile electronic device or the other computing device. As used herein, synchronization also refers to the downloading or uploading of pre-selected files from one device to the other. Synchronization of files and data can be initiated by the user of the device whenever a suitable connection between the mobile electronic device 300 and another computing device, such as a home computer, is detected, or can occur automatically when a connection is detected. A synchronization application, stored in the mobile electronic device 300 or the other computing device, or both, can determine the file and data types to be synchronized, the frequency of synchronization, and other parameters, appropriate to the particular synchronization algorithm implemented by the synchronization application.

In use, a received signal such as a text message, an e-mail message, or web page download is processed by the communication subsystem 324 and input to the processor 308. The processor 308 then processes the received signal for output to the display 332 or alternatively to the auxiliary I/O subsystem 340. A subscriber may also compose data items, such as e-mail messages, for example, using a touch-sensitive overlay (not shown) on the display 332 that is part of a touch screen display, and possibly the auxiliary I/O subsystem 340. The auxiliary I/O subsystem 340 may include devices such as: a mouse, track ball, optical navigation module, infrared fingerprint detector, or a roller wheel with dynamic button pressing capability. A composed item may be transmitted over the wireless network 1000 through the communication subsystem 324.

For voice communications, the overall operation of the mobile electronic device 300 is substantially similar, except that the received signals are output to the speaker 344, and signals for transmission are generated by the microphone 346. Alternative voice or audio I/O subsystems, such as a voice message recording subsystem, can also be implemented on the mobile electronic device 300. Although voice or audio signal output is accomplished primarily through the speaker 344, the display 332 can also be used to provide additional information such as the identity of a calling party, duration of a voice call, or other voice call related information.

In the preceding description, for purposes of explanation, numerous details are set forth in order to provide a thorough understanding of the implementations described herein. However, one skilled in the art will understand that these specific details are not required in order to practice the implementations. In other instances, well-known electrical structures and circuits are shown in block diagram form in order not to obscure the implementations. For example, specific details are not provided as to whether the implementations described herein are implemented as a software routine, hardware circuit, firmware, or a combination thereof.

Implementations described herein can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform actions in a method according to an implementation described herein. Those of ordinary skill in the art will appreciate that other instructions and operations necessary to implement the described implementations can also be stored on the machine-readable medium. Software running from the machine-readable medium can interface with circuitry to perform the described tasks.

The above-described implementations are intended to be examples only. Alterations, modifications and variations can be effected to the particular implementations by those of skill in the art without departing from the scope, which is defined solely by the claims appended hereto.

What is claimed is:

1. A transport frame for testing a battery-powered electronic device-under-test (DUT) in a test fixture, the test fixture arranged to receive the transport frame and to test the DUT when the transport frame is engaged with the test fixture, the test fixture comprising a test fixture power supply arranged to provide power to the DUT in a testing stage, the transport frame comprising:
   a transport frame power supply arranged to provide power to the DUT in a pre-testing stage, the transport frame power supply being separately capable of powering the DUT from the text fixture power supply that is separately capable of powering the DUT from the transport frame power supply; and
   a switching circuit arranged to switch from the transport frame power supply to the test fixture power supply in response to receiving a first power switching signal indicating satisfaction of a pre-testing condition, and arranged to switch from the test fixture power supply to the transport frame power supply in response to receiving a second power switching signal indicating completion of a testing stage.

2. The transport frame of claim 1 further comprising a switching controller to control power switching between the transport frame power supply and the test fixture power supply, the switching controller being arranged to generate the first and second power switching signals.

3. The transport frame of claim 1 wherein the switching circuit is in communication with a switching controller configured to control power switching between the transport frame power supply and the test fixture power supply, the switching controller being arranged to generate the first and second power switching signals.

4. The transport frame of claim 2 wherein the switching controller comprises a machine readable medium storing statements and instructions for execution by a processor to control power switching between the transport frame power supply and the test fixture power supply.

5. The transport frame of claim 1 wherein the switching circuit comprises a load switch.

6. The transport frame of claim 5 wherein the load switch comprises a metal oxide semiconductor field effect transistor (MOSFET).

7. The transport frame of claim 1 wherein the switch from the transport frame power supply to the test fixture power supply causes a voltage drop, and wherein the switching circuit is arranged such that the voltage drop is below a reboot tolerance for the DUT.

8. The transport frame of claim 1 wherein the switching circuit comprises an isolator arranged to electrically isolate the transport frame power supply from the test fixture power supply.

9. The transport frame of claim 1 wherein the transport frame power supply comprises a battery.

10. The transport frame of claim 9 wherein the battery comprises encryption restricting use of the battery to a device model represented by the DUT.

11. The transport frame of claim 1 wherein the battery-powered electronic device-under-test comprises a mobile device.

12. A method of power switching in a system for testing a battery-powered electronic device-under-test (DUT), the system including a transport frame and a test fixture arranged to receive the transport frame and to test the DUT when the transport frame is engaged with the test fixture, the method comprising:
   providing power to the DUT in a pre-testing stage via a transport frame power supply when the DUT is housed in the transport frame;
   switching from the transport frame power supply to a test fixture power supply in response to a first power switching signal indicating satisfaction of the pre-testing condition; and
   switching from the test fixture power supply to the transport frame power supply in response to receiving a second power switching signal indicating completion of the testing stage, the transport frame power supply being separately capable of powering the DUT from the text fixture power supply that is separately capable of powering the DUT from the transport frame power supply.

13. The method of claim 12 wherein the first power switching signal comprises an indication that the transport frame is inserted in the test fixture and the test fixture power supply is turned on.

14. The method of claim 12 further comprising determining whether the pre-testing condition is satisfied.

15. The method of claim 12 further comprising initiating the testing stage in response to receiving a test initiation signal indicating the DUT is ready for initiation of the testing stage.

16. The method of claim 12 further comprising determining whether the DUT is ready for initiation of the testing stage.

17. The method of claim 16 wherein determining whether the DUT is ready for initiation of the testing stage comprises receiving a determination that current drawn from the DUT is substantially similar to a known targeted idle current of the DUT.

18. The method of claim 16 further comprising determining that current drawn from the DUT is substantially similar to a known targeted idle current of the DUT.

19. A computer-readable medium storing statements and instructions for execution by a processor to perform the method of claim 12.

20. A system for testing a battery-powered electronic device-under-test (DUT), comprising:
   a transport frame arranged to receive the DUT;
   a transport frame power supply arranged to provide power to the DUT in a pre-testing stage;
   a test fixture arranged to receive the transport frame and to test the DUT when the transport frame is engaged with the test fixture;
   a test fixture power supply arranged to provide power to the DUT after satisfaction of a pre-testing condition, the transport frame power supply being separately capable of powering the DUT from the text fixture power supply that is separately capable of powering the DUT from the transport frame power supply; and
   a switching circuit arranged to switch from the transport frame power supply to the test fixture power supply in response to receiving a first power switching signal indicating satisfaction of the pre-testing condition, and arranged to switch from the test fixture power supply to the transport frame power supply in response to receiving a second power switching signal indicating completion of the testing stage.

21. The system of claim 20 wherein the transport frame power supply is provided within the transport frame.

22. The system of claim 20 wherein the test fixture power supply is provided within the test fixture.

23. The system of claim 20 wherein the test fixture further comprises a charging circuit arranged to charge the test fixture power supply.

\* \* \* \* \*